US006861835B2

(12) United States Patent
Maly et al.

(10) Patent No.: US 6,861,835 B2
(45) Date of Patent: Mar. 1, 2005

(54) METHOD AND SYSTEM FOR NON-INVASIVE POWER TRANSISTOR DIE VOLTAGE MEASUREMENT

(75) Inventors: Douglas K. Maly, Jefferson, MA (US); Orrin B. West, Canton, MI (US); Chingchi Chen, Ann Arbor, MI (US)

(73) Assignee: Ballard Power Systems Corporation, Dearborn, MI (US)

( * ) Notice: Subject to any disclaimer, the term of this patent is extended or adjusted under 35 U.S.C. 154(b) by 42 days.

(21) Appl. No.: 10/309,793

(22) Filed: Dec. 3, 2002

(65) Prior Publication Data

US 2004/0104718 A1 Jun. 3, 2004

(51) Int. Cl.[7] .............................................. G01R 7/00
(52) U.S. Cl. .............................. 324/140 R; 324/158.1
(58) Field of Search ............................ 324/140 R, 765, 324/763, 767, 768, 769, 158.1; 315/209 R, 127; 327/424, 108, 110; 363/56.02, 127

(56) References Cited

U.S. PATENT DOCUMENTS

| 4,910,416 | A | * | 3/1990 | Salcone | 327/374 |
| 5,426,350 | A | * | 6/1995 | Lai | 315/244 |
| 5,864,211 | A | * | 1/1999 | Kiermeier | 315/127 |
| 6,091,288 | A | * | 7/2000 | Moisin | 327/545 |
| 6,448,720 | B1 | * | 9/2002 | Sun | 315/219 |
| 6,469,919 | B1 | * | 10/2002 | Bennett | 363/56.02 |
| 6,486,714 | B2 | * | 11/2002 | Ushida et al. | 327/108 |

* cited by examiner

Primary Examiner—Kamand Cuneo
Assistant Examiner—Tung X. Nguyen
(74) Attorney, Agent, or Firm—Seed IP Law Group PLLC (57) ABSTRACT

A non-invasive, non-destructive method and system for determining power transistor peak die voltage utilizes values for each of a plurality of parameters determined by measurement of external terminal voltages for any number of switches, such as transistors of an inverter. Stray inductance values are calculated and used with measured current gradient to calculate the peak die voltages for the switches. A refinement of the method determines transistor peak die voltage without measuring current.

23 Claims, 8 Drawing Sheets

METHOD AND SYSTEM FOR NON-INVASIVE POWER TRANSISTOR DIE VOLTAGE MEASUREMENT

FIELD OF THE INVENTION

The present disclosure relates generally to the field of power transistors, and more particularly to methods and systems for non-invasive power transistor die voltage determination.

BACKGROUND OF THE INVENTION

Power switches, such as insulated gate bipolar transistors (IGBTs), include single or multiple silicon dice. The peak transient voltage on these dice is a critical design limit. A device, such as an IGBT, has, for example, two primary ratings, one a voltage rating and other a current rating. For economic and performance reasons, it is typically desirable to make as full use as possible of the available voltage rating and the available current rating of a device. A device with a voltage rating, for example of 600 volts, is typically run at a much lower bus voltage or working voltage because of parasitic components. As a rule of thumb, in most applications the working voltage is set to be approximately half of the rated voltage. Accordingly, the full voltage rating of the device is typically not fully utilized.

It is noted that a steady direct current (DC) voltage supply to an inverter is not critical. Such a DC voltage may come from a variety of DC voltage sources such as batteries, fuel cells, and/or ultra-capacitors to name a few. A typical DC voltage supply may supply, for example, 300 volts to the inverter. Currently, a 600 volt rated die may typically be used in such an inverter design. The reason for using, for example, a 600 volt rated die with a 300 volt power supply is that switching the conducting current in the inverter ON and OFF causes additional voltage spikes on the die. Energy loss and heat build-up in the device are associated with switching the device OFF too slowly, so these devices are designed to switch OFF as quickly as possible. Typically, when the device is switched OFF, the voltage spikes momentarily and then falls back. Although the voltage spike may last only a microsecond, the silicon of the die may suddenly and catastrophically break down under such a voltage spike. Even a microsecond of over-voltage is enough to destroy the device.

While the peak die voltage is a crucial operating parameter for power semiconductors, the peak voltage cannot be directly measured on an off-the-shelf product. While the voltage that is measured on the outside of the device at the terminals may be 600 volts, the actual voltage inside the device will always be greater than at the terminals. Knowledge of the actual or true die voltage, indicates how much margin exists prior to breakdown.

There is a need for a way to measure this voltage on the silicon in order to fully utilize the device. One way to determine whether the voltage rating is being fully utilized is to determine the voltage on the silicon itself, because it is the silicon itself that is actually rated. However, it is very difficult to determine the voltage on an actual die because the dice are fragile and carefully protected. Usually, such a determination requires destruction of the protective packaging surrounding the die, for example by cracking open the protective packaging, and probing the particular points directly on the die. The destructive nature of this testing process has at least three distinct drawbacks. The first drawback is that the destruction of the protective packaging renders the die unusable for commercial applications. The second drawback is that only the statistically determined theoretical limit for a type of die can be determined—the actual limit for a particular die to be used in a commercial application cannot be determined without rendering the die unusable. The third drawback is that the limit of a particular die cannot be monitored during actual use of the die in a commercial application (i.e., "in the field"), and thus cannot be periodically or continually monitored, for example as the die ages.

Especially in the case of commercially available power transistor switches, the only accessible measurement points are at the external terminals. Since the voltage inside the device is unknown, the problem is typically addressed by reducing the operating voltage and/or making the switching slower. In that way, less power is available from the hardware and less energy loss and heat build-up occurs. Those skilled in the art will recognize that when switching is slowed down, the amount of current for which the customer pays is reduced for an equivalent thermal load. Thus, while it is important to utilize as much of the rated voltage of the device as possible, to do so requires methods and apparatus that non-destructively and non-intrusively determine die voltage based on terminal properties.

SUMMARY OF THE INVENTION

Methods and systems for non-invasively deriving peak die voltages based on easily accessible external terminal voltages are disclosed. The voltage of interest, i.e., the voltage on the silicon itself, is determined via external terminal measurements. This permits devices to be designed much closer to engineering limits, allowing maximum use of a given device, while still providing a suitable working margin, thus allowing a circuit to employ a device with a lower rating or allowing the working voltage to be increased based on a knowledge of the die voltage of the actual die. The methods and systems of non-invasive power transistor peak die voltage determination are based on a value for each of a plurality of parameters determined by detection of external terminal voltages for any number of switches, such as transistors used, for example, as a first or top switch and a second or bottom switch of an inverter phase.

Additional objects, advantages and novel features of the invention will be set forth in part in the description which follows, and in part will become more apparent to those skilled in the art upon examination of the following, or may be learned from practice of the invention.

DETAILED DESCRIPTION

Although transient die voltages are measured at different switching intervals and locations, it can be demonstrated that adding the two transients together is equal to the actual die voltage. Die voltage transients are a critical design constraint. However, it is nearly impossible to measure such voltages directly on a packaged product. The illustrated methods and systems determine the transient die voltage based on easily accessible terminal voltages. Based on parameters obtained from the measurement of the terminal voltages, it is possible to estimate what is occurring at the die.

According to one embodiment of the present invention, the methods and systems described herein can be applied, for example, to any power module that has one or more transistors and utilizes diodes with connections brought out to external terminals, for example via a system of bus bars and connectors, in which there is likely to be a possibility of a significant difference in voltage between what can be measured from the exterior terminals and what is actually occurring on the silicon devices. Typically, the voltage rating that is provided on the data sheet for a device refers to the silicon itself. In the process of switching very rapidly, the parasitic elements in the package prevent an observation of the true voltage on the die from the outside terminals.

The die voltages can be predicted in certain cases based on the assumption that there are two different paths that current can follow and that each one of those paths has some parasitic inductance value associated with it Referring now in detail to illustrated embodiment, in which like numerals designate like components, the illustrated embodiment provides methods and systems for non-invasive power transistor die voltage measurement by deriving a reliable estimate of peak die voltage based on device terminal characteristics.

Figure 1:
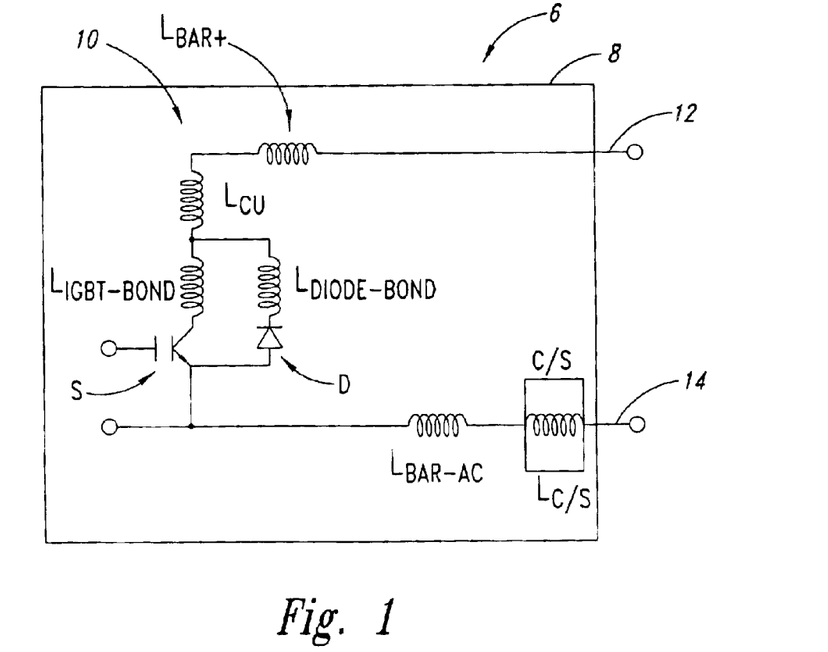
FIG. 1 is a schematic diagram of a circuit module including a protective covering and an electrical circuit model illustrating the major inductances associated with an IGBT switch for which the peak die voltages are to be measured according to an embodiment of the disclosed method and system.

FIG. 1 is a schematic diagram of a circuit module 6 including a protective covering 8 and an electrical circuit model 10 of a switch S, for example an IGBT, contained within the protective covering 8. The electrical circuit model 10 illustrates an example of the major inductances, discussed below, associated with the IGBT switch S, for which the peak die voltage is to be measured according to the illustrated embodiments. The protective covering 8 may take any of a variety of forms commonly known in the art of circuit packaging. A first and second conduction terminals (i.e., collector and emitter) of IGBT switch S are coupled to external terminals 12 and 14, respectively, a portion of which is accessible from outside of the protective covering 8.

Figure 2:
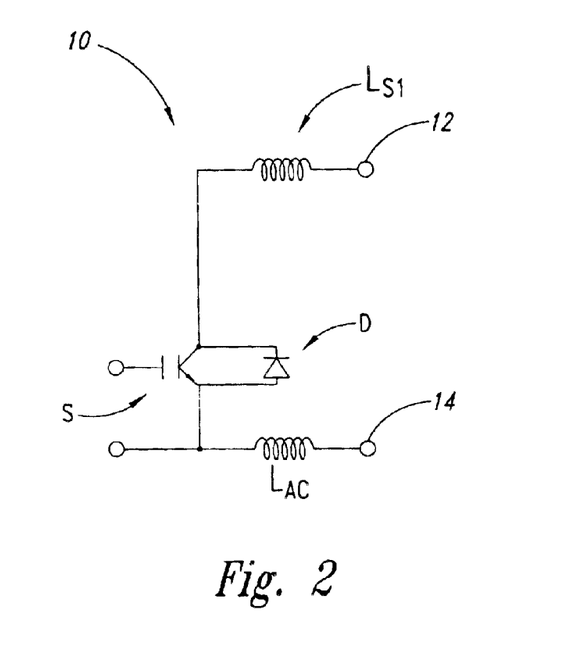
FIG. 2 is an electrical schematic diagram that illustrates a simplified model of the inductances of the exemplary IGBT switch depicted in FIG. 1.

FIG. 2 is an electrical schematic diagram illustrating a simplified model of the inductances of the exemplary IGBT switch S depicted in FIG. 1, based on the assumption that inductance $L_{DIODE-BOND}$ of the wire bonds on the IGBT is essentially equal to the inductance $L_{IGBT-BOND}$ of the wire bonds on the diode semiconductor chip, and which is discussed in detail below.

FIGS. 3 through 6 are electrical schematic diagrams illustrating an exemplary operation during a switching sequence of a circuit forming a inverter half bridge 13 having a first leg 13a formed by a first or top switch $S_1$ and anti-parallel diode D1, and a second leg 13b formed by a second or bottom switch $S_2$ and anti-parallel diode D2. A controller 15 includes circuitry for controlling the operation of the inverter 13 via an input bus 17 for receiving input such as voltage and current measurements from the external terminals of the inverter 13, and an output bus 19 for providing signals such as control signals to the gates of the switches $S_1$, $S_2$. The controller 15 may include analog and/or digital circuitry. Analog circuitry may provide better speed performance, while digital circuitry, for example a microprocessor, may provide more sophisticated control.

References herein to the "top" or "bottom" are for convenience only, and refer to the first or second switch $S_1$, $S_2$, respectively, of a serially coupled switch pair, without regard to any orientation in space or location. The first and second switches $S_1$, $S_2$ may, for example, take the form of transistors such as IGBT transistors. References to the top or bottom "device" refer to the combinations of first switch $S_1$ and first anti-parallel diode D1, and second switch $S_2$ and second anti-parallel diode D2, respectively. Note that while technically each device includes two switches (i.e., a transistor and a diode), each device is referred to herein in the singular.

The half bridge inverter 13 includes three external terminals 12, 14, and 16, at which measurements may be taken using conventional voltage and/or current measuring apparatus such as voltage sensors and current sensors. Two of the terminals 12, 16 are associated with the DC voltage bus, so, at times, are denominated "DC terminals," while the third terminal 14 is associated with the AC voltage bus, so, at times is denominated "AC terminal." One skilled in the art will note, that the terminals 12, 16 will alternatively cooperate with the AC terminal 14 to form the AC voltage bus. Thus, the denomination DC terminal does not preclude the terminal 12, 16 from forming a portion of the AC voltage bus.

Figure 3:
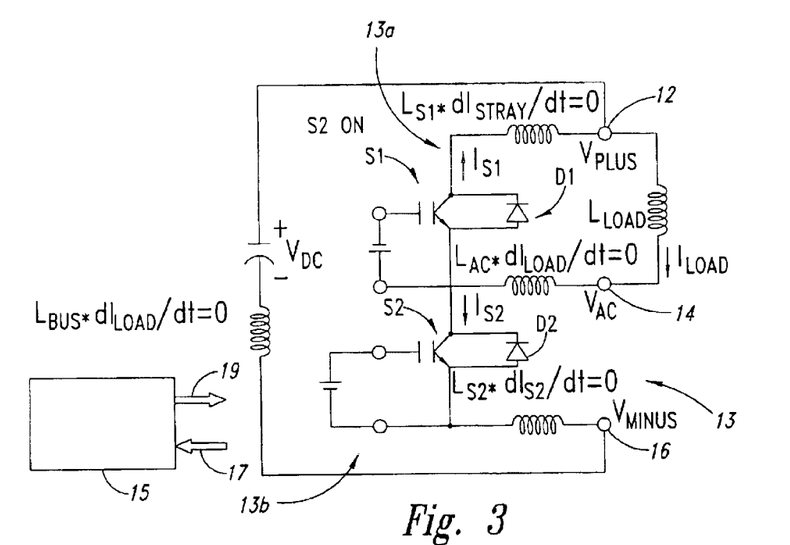
FIGS. 3 through 6 are electrical schematic diagrams illustrating a switching sequence in an inverter half bridge with a first or top switch and a second or bottom switch, such as the switch of FIG. 1, at successive intervals.
Figure 4:
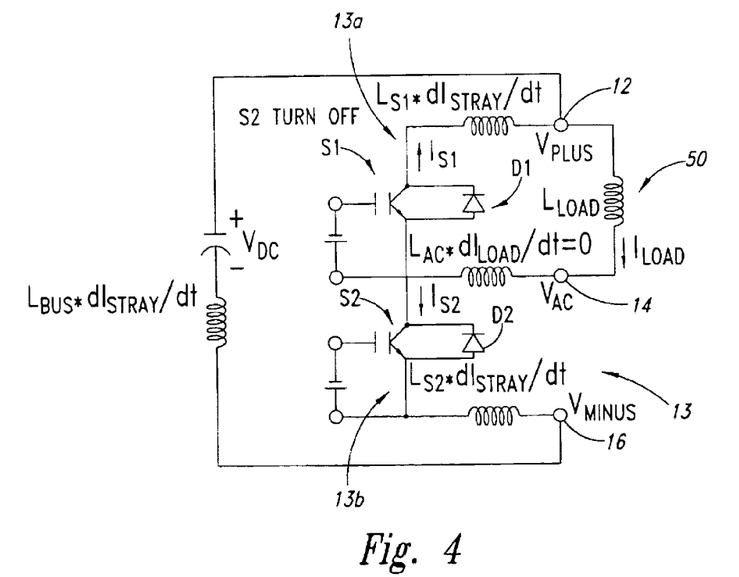
Figure 5:
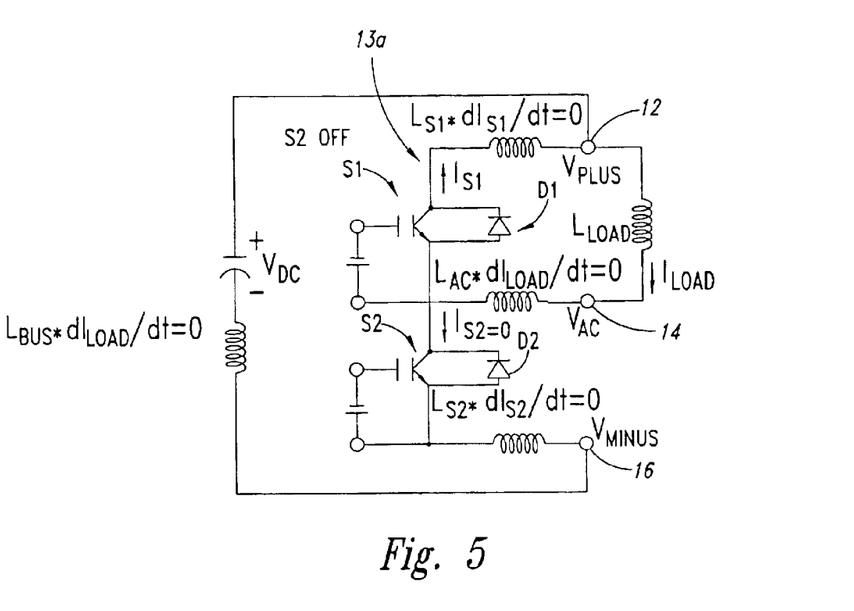
Figure 6:
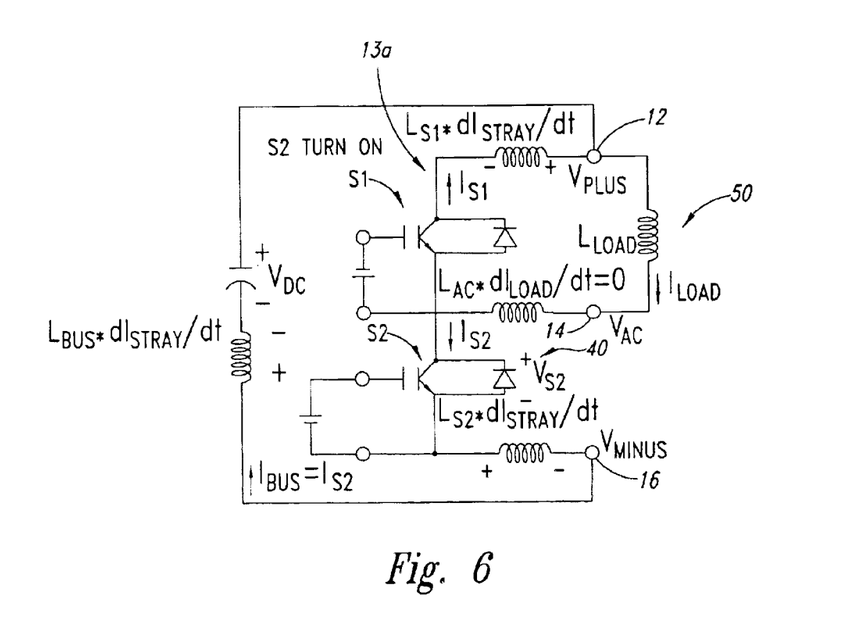

FIG. 3 illustrates the operation of the half bridge 13 at an interval when the second switch $S_2$ is in an ON state, where the current $I_{S2}$ passing through the second switch $S_2$ is full, while the current $I_{S1}$ passing through the first switch $S_1$ is zero. FIG. 4 illustrates the operation of the half bridge 13 during an interval when the second switch $S_2$ is being switched into an OFF state, the currents $I_{S2}$ and $I_{S1}$ passing in both directions for a short period of time. FIG. 5 illustrates the operation of the half bridge 13 at an interval when the second switch $S_2$ is in the OFF state. FIG. 6 illustrates the operation of the half bridge 13 at an interval when the second switch $S_2$ is being switched into the ON state. The currents can be treated as direct current (DC) for the time intervals that are relevant in this discussion.

Referring further to FIGS. 3 through 6, the voltages at the terminals 12 and 14, or 14 and 16, of the switches $S_1$, $S_2$ can be measured, which enables the die voltages $V_{DIE-S1}$, $V_{DIE-S2}$ to be determined through application of the invention. (The particular pair of terminals for which the voltage is measured depends on which switch $S_1$, $S_2$ is turned ON when the measurement is made.)

One embodiment of the present method and system involves measuring peak voltages at the terminals 12 and 14, or 14 and 16, for switching transients. When the second switch $S_2$ is being switched, the voltage is a measure of the stray inductance of the first switch $S_1$. Conversely, when the first switch $S_1$ is being switched, the voltage is a measure of the stray inductance of the second switch $S_2$.

In the switching sequence for the half bridge 13, as shown in FIGS. 3 through 6, use is made of the first switch $S_1$ and the second switch $S_2$. In FIG. 3, the second switch $S_2$ is ON and carries the full current $I_{S2}$. While the first switch S1 is OFF, some current $I_{S1}$ passes via the diode associated with the first switch $S_1$ during turn OFF of the second switch $S_2$. If the second switch $S_2$ is being switched, as represented in FIGS. 4 and 6, the voltage is measured at the AC terminal 14 and the positive terminal 14.

Referring back to FIG. 1, the schematic diagram models the major "stray" inductances of an IGBT switch S for which the peak die voltage is to be measured, including $L_{BAR+}$, $L_{CU}$, $L_{IGBT-BOND}$, $L_{DIODE-BOND}$, $L_{BAR-AC}$, and $L_{C/S}$. $L_{BAR+}$ is the inductance of the positive bus bar. In this regard, it is noted that there are, for example, two kinds of bus bars. In the present example, use is made of an internal bus bar on the inside of the module with terminals to the external world having an internal bus bar inductance $L_{BAR+}$. It is to be noted that the internal bus bar should not be confused with an external bus bar. Proceeding in the circuit past the internal bus bar, the first thing encountered is copper on the substrate that mounts the semiconductors. Diodes, such as diode D shown in FIG. 1, are semi-conductor chips that are disposed on a substrate. The top of the substrate is a conductor (commonly copper) and has an associated inductance $L_{CU}$. The wire bonds on the IGBT semiconductor have an associated inductance $L_{IGBT-BOND}$. The wire bonds on the diode semiconductor chip have an associated inductance $L_{DIODE-BOND}$, the internal ac bus bar has an associated inductance $L_{BAR-AC}$, and the current sensor, if it exists, has an associated inductance $L_{C/S}$.

Referring back to FIG. 2, the simplified model of the inductances combines the separate inductances, $L_{BAR+}$, $L_{CU}$, $L_{IGBT-BOND}$, $L_{DIODE-BOND}$, $L_{BAR-AC}$, and $L_{C/S}$, based on the assumption that the difference between $L_{DIODE-BOND}$ and $L_{IGBT-BOND}$ may be neglected. The simplified model according to FIG. 2 is then used to model the die voltages, assuming that $L_{DIODE-BOND}$ is approximately equal to $L_{IGBT-BOND}$, $L_{S1}$ is the sum of $L_{BAR+}$, $L_{CU}$ and the final two inductances in parallel. $L_{AC}$ is the sum of $L_{BAR-AC}$ and $L_{C/S}$.

In some aspects, the present system and method depend on a parasitic path from the diode and a parasitic path from the transistor. Since the two bond wire inductances $L_{DIODE-BOND}$ and $L_{IGBT-BOND}$ comprise a relatively low proportion of the total inductance (i.e., the magnitude the two inductances is low in comparison to the total inductance), the difference in that the values of the two bond wire inductances, $L_{DIODE-BOND}$ and $L_{IGBT-BOND}$ may be neglected. For example, even if $L_{DIODE-BOND}$ and $L_{IGBT-BOND}$ are as much as 50% different (with the difference being typically less), this difference would be insignificant relative to the total inductance. Accordingly, $L_{DIODE-BOND}$ and $L_{IGBT-BOND}$ can be combined as illustrated in FIG. 2. Thus, as shown in FIG. 2, all of the inductances that can be considered as essentially a single inductance are combined and are represented as $L_{S1}$, and $L_{AC}$, and the die voltage can then be derived from measurements taken at the external terminals.

Referring to FIG. 4, while the second switch $S_2$ is being switched OFF:

$$V_{DIE-S2}=V_{DC}+(L_{BUS}+L_{S1}+L_{S2})*dI_{STRAY}/dt \quad (1)$$

It is clear that the earlier defined relationship $L_{AC}$ equals $L_{BAR-AC}$ plus $L_{C/S}$ is not part of equation (1), even if the current gradient dI/dt during switch OFF is not zero. $V_{DIE-S2}$ is the voltage on the bottom die, which is the die in the IGBT which is being measured, and is equal to the sum of the inductance of the external bus bar $L_{BUS}$, the total inductance $L_{S1}$ of the first switch $S_1$ and the total inductance $L_{S2}$ of the second switch $S_2$, multiplied by the current gradient $dI_{STRAY}/dt$, plus the DC bus voltage, VDC.

Referring to FIG. 4, when the second switch $S_2$ is switched, the voltages $L_{BUS}*dI_{STRAY}/dt\{S_2 \text{ OFF}\}$ and $L_{S1}*dI_{STRAY}/dt\{S_2 \text{ OFF}\}$ are measured directly, and the only unknown is $L_{S2}*dI_{STRAY}/dt\{S_2 \text{ OFF}\}$. The complementary circuit (not shown), with a load 50 from the AC terminal 14 to the negative terminal 16 having an inductance $L_{LOAD}$, can be constructed, and the voltages, $L_{BUS}*dI_{STRAY}/dt\{S_1\text{OFF}\}$ and $L_{S2}*d_{STRAY}/dt\{S_1\text{OFF}\}$, can be measured directly, with $L_{S1}*dI_{STRAY}/dt\{S_1 \text{ OFF}\}$ unknown.

Referring to the complementary circuit with a load 50 from the AC terminal 14 to the negative terminal 16 having an inductance $L_{LOAD}$, since $V_{DC}$ is modeled as an ideal voltage source, $V_{DC}$ does not change in value during the commutation. However, $V_{PLUS}$ at the positive terminal 12 and $V_{MINUS}$ at the negative terminal 16 actually change relative to $V_{DC}$ during commutation, because a voltage is generated across $L_{BUS}$. Although $V_{DC}$ is modeled as an ideal voltage source, in reality the bus inductance $L_{BUS}$ maps the change in the ideal voltage at the terminals. In other words, $V_{DC}$ is an ideal voltage, there is a voltage generated on the external bus bar, so $V_{PLUS}$ and $V_{MINUS}$ will have transients. The DC voltage is essentially constant, but during the switching interval, $V_{PLUS}$ and $V_{MINUS}$ will have transient voltages generated by the external bus bar.

In addition, further approximations can be made to accommodate measurement non-idealities. Referring again to FIG. 4, when switch $S_2$ is being switched OFF, the inductance of the external bus bar, $L_{BUS}$, is directly calculated as the ideal DC bus voltage, $V_{DC}$, less the difference between $V_{PLUS}$ and $V_{MINUS}$, divided by the current gradient, $dI_{STRAY}/dt\{S_2 \text{ OFF}\}$. That is, $L_{BUS}$ can be measured according to the equation:

$$L_{BUS}=[V_{DC}-(V_{PLUS}-V_{MINUS})]/[dI_{STRAY}/dt]\{S_2 \text{ OFF}\} \quad (2)$$

Also, when the second switch $S_2$ is being switched OFF, the internal inductance of switch $S_1$, $L_{S1}$, is directly calculated by subtracting $V_{PLUS}$ from $V_{AC}$ (i.e. determining the voltage across switch $S_1$), then dividing the difference by the current gradient, $dI_{STRAY}/dt\{S_2\text{OFF}\}$. That is:

$$L_{S1}=[V_{AC}-V_{PLUS}]/[dI_{STRAY}/dt]\{S_2\text{OFF}\} \quad (3)$$

For the complementary circuit, when the first switch S1 is being switched OFF, $L_{BUS}$ is directly calculated again as follows:

$$L_{BUS}=[V_{DC}-(V_{PLUS}-V_{MINUS})]/[dI_{STRAY}/dt]\{S_1\text{OFF}\} \quad (4)$$

Thus, the calculation of $L_{BUS}$ and $LS_2$ for the complementary circuit during first switch $S_1$ turn OFF is exactly the same, advantageously providing a second measurement. Since the first switch $S_1$ is a different device then the second switch $S_2$ with different current gradients, it provides a different means of measuring $L_{BUS}$, and thus acts as a check of the bus inductance $L_{BUS}$ determination. The two calculations should provide the same result, otherwise the measurement set-up should be investigated.

For the complementary circuit, when the first switch $S_1$ is being switched, the second switch inductance $L_{S2}$ is directly calculated as follows:

$$L_{S2}=[V_{MINUS}-V_{AC}]/[dI_{STRAY}/dt]\{S_1\text{OFF}\} \quad (5)$$

Thus, the second switch inductance $L_{S2}$ is the voltage generated across the switch, $V_{MINUS}$, less $V_{AC}$, divided by the current gradient, $dI_{STRAY}/dt\{S_1\text{OFF}\}$.

These "stray" inductance values can then be used with measured current gradient, $dI_{STRAY}/dt\{S_2OFF\}$, and the overvoltage generated on the second switch $S_2$, $V_{DIE-S2}$, equals the ideal bus voltage, $V_{DC}$, plus the current gradient, $dI_{STRAY}/dt\{S_2\ OFF\}$, multiplied by all series inductances, including the external bus bar inductance, $L_{BUS}$, switch $S_1$ internal inductance, $L_{S1}$, and switch $S_2$ internal inductance, $L_{S2}$.

Equation 6 summarizes this calculation:

$$V_{DIE-S2}=V_{DC}+(L_{BUS}+L_{S1}+L_{S2})*dI_{STRAY}/dt\{S_2OFF\} \quad (6)$$

Interestingly, the equation for calculation of $V_{DIE-S1}$ for switching OFF of the first switch $S_1$ is equivalent:

$$V_{DIE-S1}=V_{DC}+(L_{BUS}+L_{S1}+L_{S2})*dI_{STRAY}/dt\{S_1OFF\} \quad (7)$$

The fact that equations 6 and 7 are equivalent represents an important aspect of the present disclosure. The difference is that when measuring the voltage, $V_{DIE-S2}$, the second switch $S_2$ is being switched, and when measuring the voltage, $V_{DIE-S2}$, the first switch $S_1$ is being switched, i.e. the voltage of interest is on the switch that is being switched. Similarly, when second switch $S_2$ is being switched, the current gradient in switch $S_2$, $dI_{STRAY}/dt\{S_2\ OFF\}$, is of interest, and when first switch $S_1$ is being switched, the current gradient in switch $S_2$, $dI_{STRAY}/dt\{S_1OFF\}$, is of interest.

Although the terminal voltages measured will be different because, in general, $L_{S1}$, is not equal to $L_{S2}$, the die voltages are the same, unless the current gradient, $dI_{STRAY}/dt\{S_2\ OFF\}$, is not equal to the current gradient, $dI_{STRAY}/dt\{S_1\ OFF\}$. However, since these gradients are a characteristic of the chips, it is expected that they will be comparable. An implicit assumption from the foregoing is that, using the example of the second switch $S_2$ being switched OFF, the first switch inductance $L_{S1}$ is measured with diode current, and the measured value for the first switch inductance $L_{S1}$ is used in equation 7, where current flows through the IGBT chip. The approximation error is equivalent to the difference between $L_{IGBT-BOND}$ and $L_{DIODE-BOND}$. However, the approximation is reasonable as the difference is not expected to be great, and more importantly, the die bond inductance is a relatively small component of $L_{S1}$ and $L_{S2}$.

During switching, the currents are generally not exactly the same, but in any event, that is the only difference between the operation of the two switches $S_2$, $S_2$. Different devices are being switched, but the equations are exactly the same. Because of this, once the current gradient, $dI_{STRAY}/dt$, is measured, the voltage on either the first switch $S_1$ or the second switch $S_2$ is known. For example, it is not necessary to proceed on the basis that the voltage on the second switch $S_2$ is dependent only on the bottom internal inductance of switch $S_2$, $L_{S2}$, or that the voltage on the first switch $S_1$ is dependent only on the internal inductance of switch $S_2$, $L_{S2}$, which is not true since, as shown in equation 6, switch $S_2$ overvoltage, $V_{DIE-S2}$, depends on the ideal external bus bar voltage $V_{DC}$, first switch $S_1$ internal inductance $L_{S1}$, and second switch $S_2$ internal inductance $L_{S2}$. Similar logic applies to $V_{DIE-S1}$, as shown in equation 7.

As outlined above, embodiments of the present system and method enable a die voltage to be measured quickly based only on external terminal measurements. This also allows the die voltage to be monitored, such as in a circuit, where, for example, the device can be placed in a circuit, such as a power converter circuit, and it is possible to determine the die voltage inside the power converter through external measurements only.

Figure 7A:
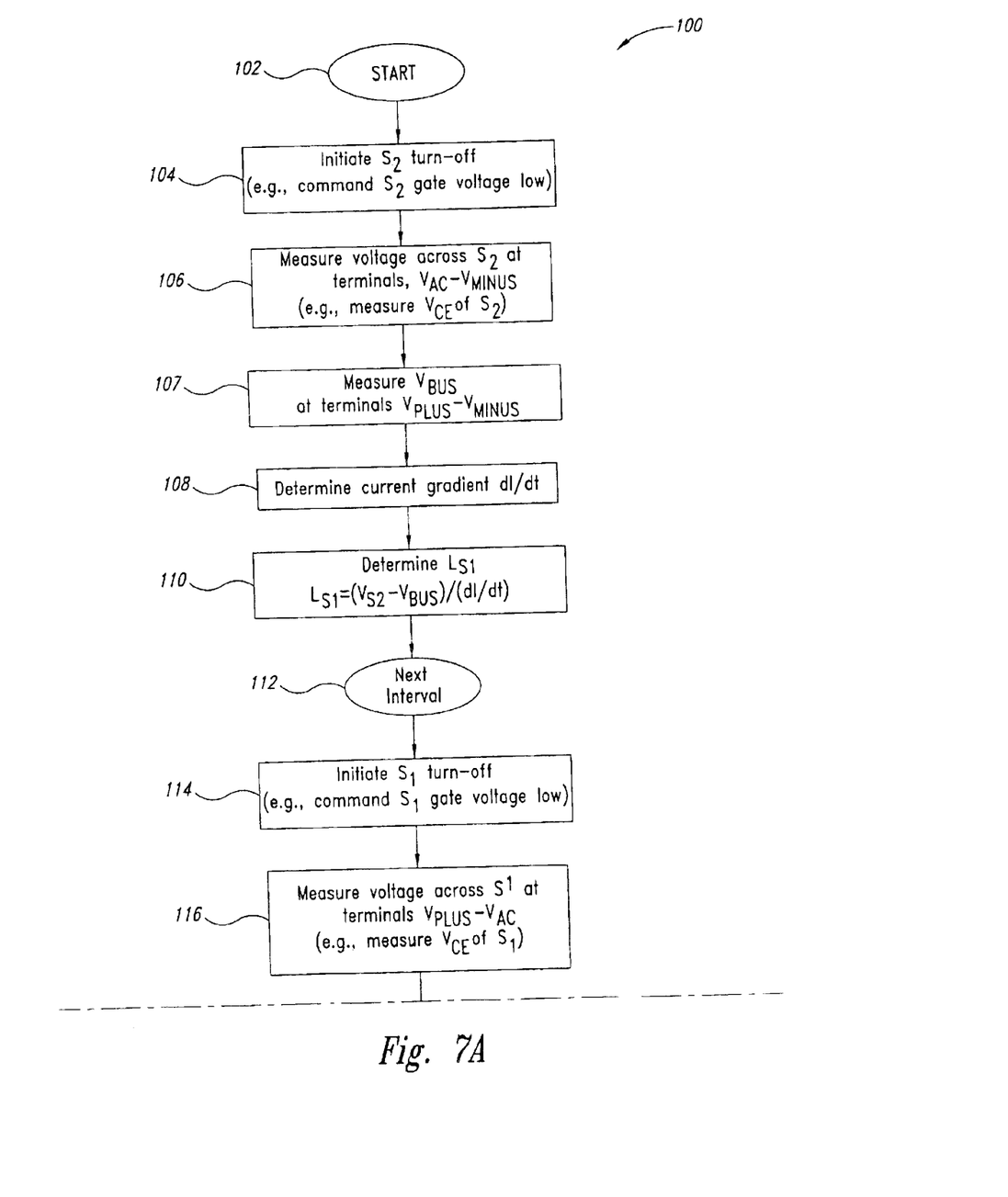
FIGS. 7A and 7B are a flow chart illustrating one method of non-invasively determining a die voltage according to one illustrated embodiment of the present invention.
Figure 7B:
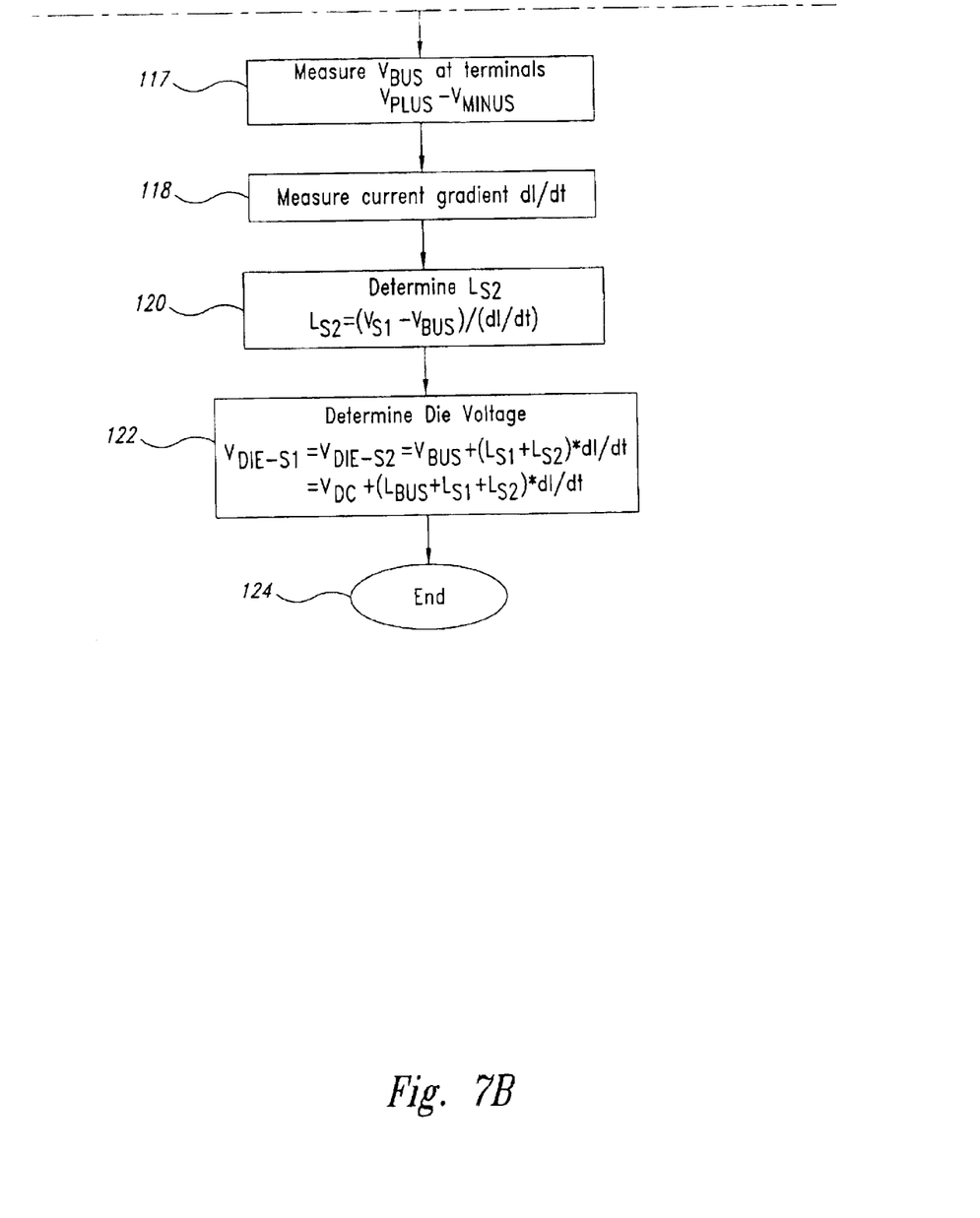

FIGS. 7A and 7B constitute a flow chart which illustrates one exemplary method 100 of determining a die voltage, starting in step 102.

In step 104, the second switch $S_2$ is turned off, for example by applying an appropriate control signal such as a low voltage to a control terminal of the second switch $S_2$, such as a gate of a transistor, for example an IGBT transistor.

In response, the voltage across the conducting terminals of the second switch $S_2$ rises until it becomes approximately equal with the bus voltage $V_{BUS}$, and the voltage across the conducting terminals of the second switch $S_2$ is determined in step 106. For example, the voltage across the conducting terminals of the second switch $S_2$ may be determined by measuring the voltage across the external AC terminal 14 and the positive or first external DC terminal 12 (FIGS. 3–6) when switching OFF the second switch $S_2$. Where the second switch $S_2$ is a transistor such as an IGBT, the voltage across the conducting terminals may take the form of a collector-emitter voltage $V_{CE}$ of the transistor.

In step 107, the bus voltage $V_{BUS}$ is determined. For example, the bus voltage $V_{BUS}$ may be measured across the DC terminals 12, 16 via a voltage sensor.

The current $I_{S2}$ begins to turn OFF in response to the turning OFF of the second switch $S_2$, and the current gradient dI/dt is determined in step 108. For example, the current gradient dI/dt may be measured by way of a current sensor such as a current shunt or current transformer, as is commonly understood in the art.

In step 110, the inductance $L_{S1}$, of the first switch $S_1$ is determined based on the voltage across the conducting terminals $V_{CE}$, the bus voltage $V_{BUS}$, and the current gradient dI/dt. The inductance $L_{S1}$, of the first switch $S_1$ may be determined according to the formula $L_{S1}=(V_{CE}$ of switch $S_2-V_{BUS})$ /dI/dt.

Starting at a next interval 112, the first switch $S_1$ is turned OFF, for example, by applying an appropriate control signal such as a low voltage to a control terminal of the first switch $S_1$ in step 114. In response, the voltage across the conducting terminals of the first switch $S_1$ rises until it becomes approximately equal with the bus voltage $V_{BUS}$, and the voltage across the conducting terminals of the first switch $S_1$ is determined, for example by measuring the voltage across external terminals 12, 14 in step 116.

In step 117, the bus voltage $V_{BUS}$ is determined. For example, the bus voltage $V_{BUS}$ may be measured across the DC terminals 12, 16 via a voltage sensor.

The current $I_{S1}$ begins to turn OFF in response to the turning OFF of the first switch $S_2$, and in step 118 the current gradient dI/dt is again determined via conventional structures and methods.

In step 120, the inductance $L_{S2}$ of the second switch $S_2$ is determined based on the voltage across the conducting terminals $V_{CE}$, the bus voltage $V_{BUS}$, and the current gradient dI/dt. The inductance $L_{S2}$ of the second switch $S_2$ may be determined according to the formula $L_{S2}=(V_{CE}$ of switch $S_1-V_{BUS})/dI/dt$.

In step 122, the die voltages ($V_{DIE-S2}$, $V_{DIE-S2}$) are determined based on the determined bus voltage $V_{BUS}$, the determined switch inductances $L_{S1}$, $L_{S2}$ and the determined current gradient dI/dt. As illustrated, the method 100 terminates in step 124, however the method can repeat on an on-going basis, as may be suitable for the particular application, for example in the field monitoring.

Figure 8A:
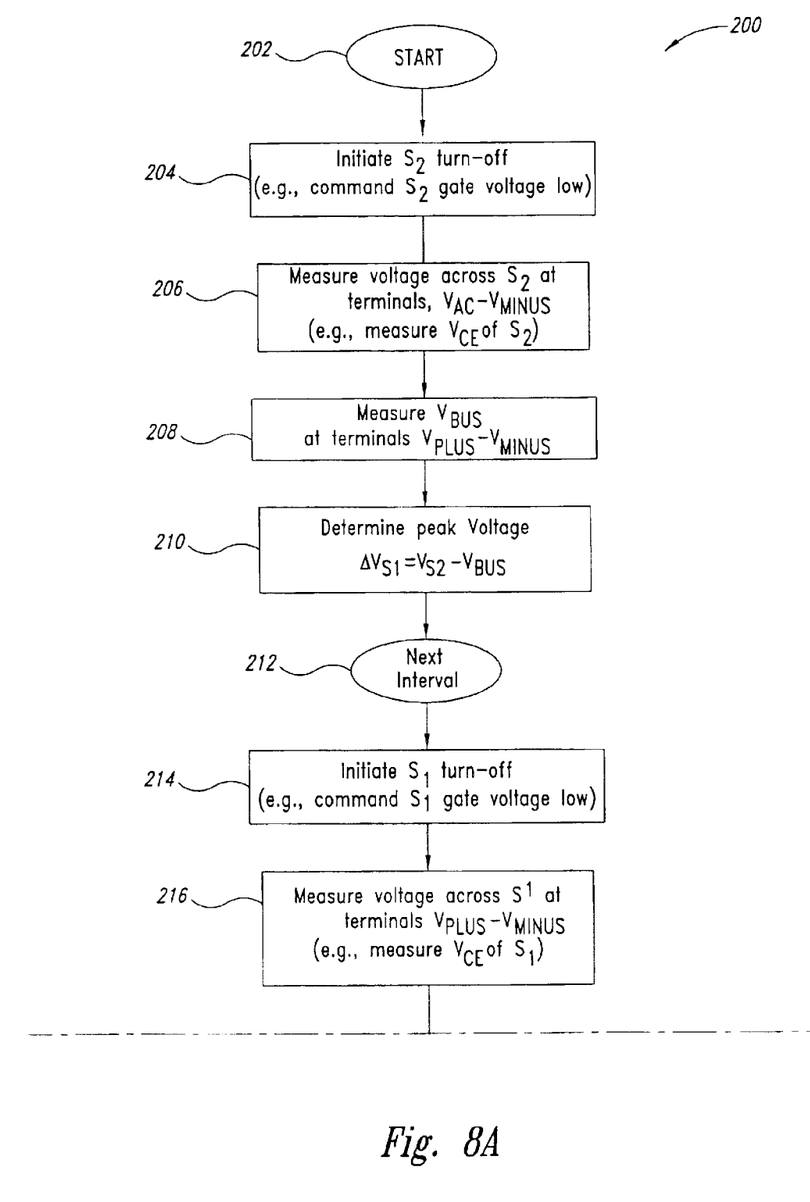
FIGS. 8A and 8B are a flow chart illustrating another method of non-invasively determining a die voltage according to another illustrated embodiment of the present invention.
Figure 8B:
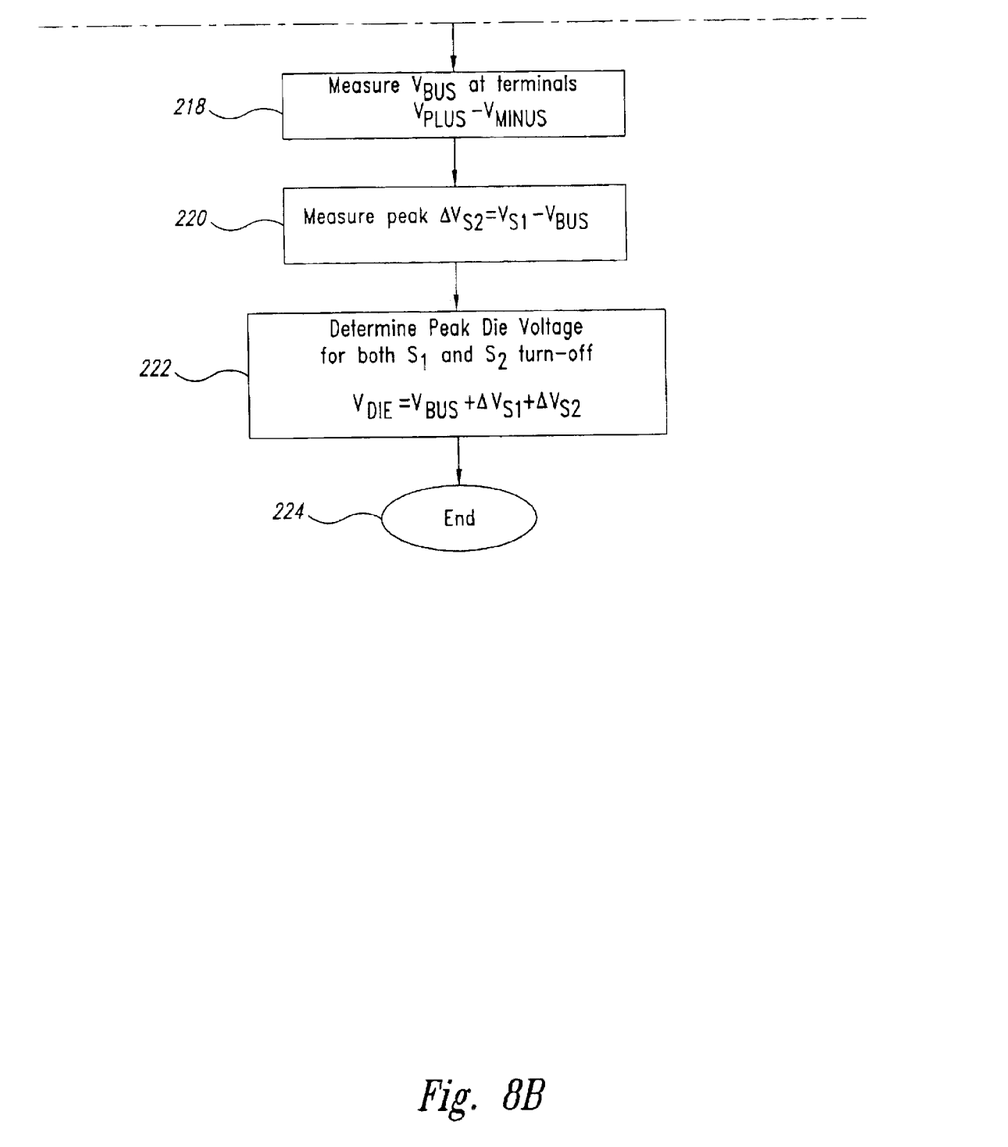

FIGS. 8A and 8B constitute a flow chart illustrating another exemplary method 200 of determining a die voltage, starting in step 202. The method 200 eliminates the need to know the current and the current gradient (i.e., $dI_{STRAY}/dt$).

In step 204, the second switch $S_2$ is turned off, for example by applying an appropriate control signal such as a low voltage to a control terminal of the second switch $S_2$, such as a gate of a transistor, for example an IGBT transistor.

In response, the voltage across the conducting terminals of the second switch $S_2$ is determined in step 206. For example, the voltage across the conducting terminals of the second switch $S_2$ may be determined by measuring the voltage across an external AC terminal 14 (FIGS. 3–6) and at a positive or first external DC terminal 12 (FIGS. 3–6) when switching OFF the second switch $S_2$ (FIGS. 3–6). Where the second switch $S_2$ is a transistor such as an IGBT, the voltage across the conducting terminals may take the form of a collector-emitter voltage $V_{CE}$ of the transistor.

In step 208, the bus voltage $V_{BUS}$ is determined. In step 210, the peak voltage $\Delta V$ of the first switch $S_1$ is determined. The peak voltage may be determined based on the collector-emitter voltage $V_{CE}$ of the second switch $S_2$ and bus voltage $V_{BUS}$, for example, where $\Delta V_{S1} = V_{CES2} - V_{BUS}$.

Starting at a next interval 212, the first switch $S_1$ is turned OFF, for example, by applying an appropriate control signal such as a low voltage to a control terminal of the first switch $S_1$ in step 214.

In response, the voltage across the conducting terminals of the first switch $S_1$ is determined, for example by measuring the voltage across external terminals 12, 14 in step 216.

In step 218, the bus voltage $V_{BUS}$ is determined. In step 220, the peak voltage $\Delta V$ of the first switch $S_1$ is determined. The peak voltage may be determined based on the collector-emitter voltage $V_{CE}$ the first switch $S_1$ and bus voltage $V_{BUS}$, for example, where $\Delta V_{S2} = V_{S1} - V_{BUS}$.

In step 222, the die voltages are determined based on the peak voltage difference, the bus voltage $V_{BUS}$ and the bus voltage difference, for example where $V_{DIE} = V_{BUS} + \Delta V_{S1} + \Delta V_{S2}$. The method 200 terminates at step 224, although the method 200 can repeat on an on-going basis, as may be suitable for the particular application, for example in the field monitoring. While shown as sequential steps for sake of illustration, the voltage measurements are taken at the same time, at the peak voltage. For example, the voltages may be measured at about 320 ns, as illustrated in FIG. 9.

Figure 9:
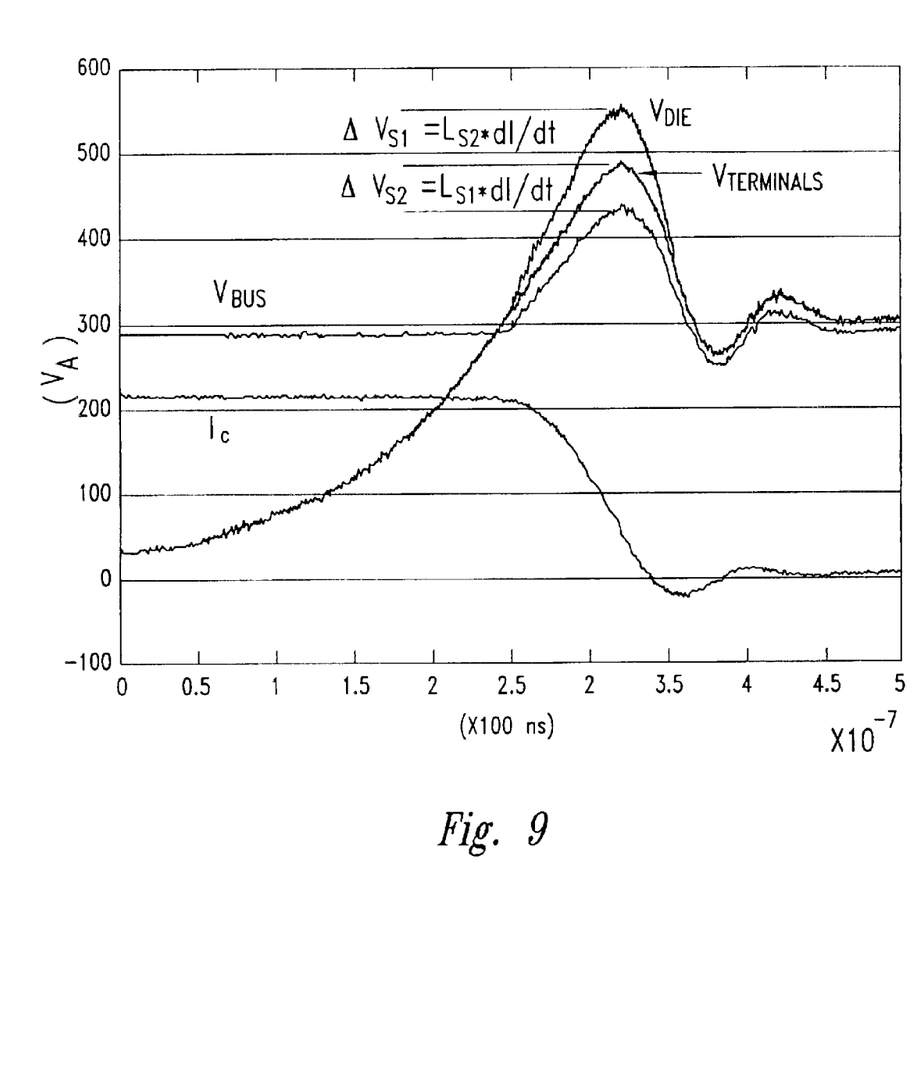
FIG. 9 is a graph illustrating an exemplary transient response of an inverter, showing voltage in Volts and the current along a vertical axis and time in nanoseconds along a horizontal axis.

FIG. 9 is a graph illustrating an exemplary transient response of an inverter. One skilled in the art will recognize that the graph of FIG. 9 is merely illustrative, and should not be read as limiting the disclosed embodiments to any particular inverter, voltage, current, or particular transient response.

The graph illustrates the bus voltage $V_{BUS}$, in Volts, and the collector current $I_C$, in Amps, as a function of time, in nanoseconds. The graph also illustrates the voltage at the external terminals $V_{TERMINALS}$, as well as the change in voltage $\Delta V_{S1}$, $\Delta V_{S2}$ for each of the first and second switches $S_1$, $S_2$, respectively.

From FIG. 9 and the above description, it is clear that a system can determine the peak die voltage(s) without destroying or damaging the dice, allowing commercial use of the actually tested dice and/or in the field monitoring. In the method, the voltage is measured across the external AC terminal and the first or positive external DC terminal of the inverter. The measured voltage is equal to $L_{S1}$, multiplied by $dI_{STRAY}/dt\{S_2\ OFF\}$, where $L_{S1}$ is the lumped inductance of the first switch and $dI_{STRAY}/dt\{S_2\ OFF\}$ is the current gradient when switching OFF the second switch $S_2$. The voltage is also measured across the first or positive external DC terminal and the second or negative DC terminal. The measured voltage is equal to $L_{BUS}$ multiplied by $dI_{STRAY}/dt\{S_2\ OFF\}$, where $L_{BUS}$ is the total inductance of the external bus and $dI_{STRAY}/dt\{S_2\ OFF\}$ is the current gradient when switching OFF the second switch $S_2$.

Since all current gradients are equal in magnitude, $I_{LOAD} = I_{S1} + I_{S2}$ and $dI_{LOAD}/dt = 0$ then $|dI_{S1}/dt| = |dI_{S2}/dt|$. This is a useful relationship. For example, where the voltage is given as $V_{S1} = L_{S2}\ |dI_{S1}/dt|$ and $I_{S1}$ is difficult to measure, the voltage can be determined from $V_{CE1} = L_{S1}|I_{S2}/dt|$ or $V_{CE1} = L_{S1}|dI_{STRAY}/dt|$ where $|dI_{STRAY}/dt| = |dI_{S1}/dt| = |dI_{S2}/dt|$.

For the complementary circuit, when switching OFF the first switch $S_1$, the voltage is also measured across the DC terminals, and is equal to $L_{BUS}$ multiplied by $dI_{STRAY}/dt\{S_1\ OFF\}$, where $L_{BUS}$ is the inductance of the external bus bar and $dI_{STRAY}/dt\{S_1 OFF\}$ is the current gradient when switching OFF the first switch $S_1$. Also for the complementary circuit, when switching OFF the first switch, the voltage is measured across the AC terminal and the second or negative external DC terminal. This measured voltage is equal to $L_{S2}$ multiplied by $dI_{STRAY}/dt\{S_1 OFF\}$, where $L_{S2}$ is the total inductance of the second switch $S_2$ and $dI_{STRAY}/dt\{S_1\ OFF\}$ is the current gradient when switching OFF the first switch $S_1$.

Inductances are calculated for an external DC bus bar and for the first switch based on an ideal bus voltage and the measured voltages at the external AC terminal, the first or positive external DC terminal, and the second or negative external DC terminal, and a measured current gradient, when switching OFF the second switch. The inductance for the external DC bus bar is calculated according to an equation, $L_{BUS} = (V_{PLUS} - V_{MINUS})\ /[dI_{STRAY}/dt]\{S_2\ OFF\}$, where $L_{BUS}$ is the total inductance of the DC bus, including bus bar, capacitor effective series inductance (CESL), etc. $V_{DC}$ is an ideal DC bus voltage, $V_{PLUS}$ is the voltage at the first or positive external DC terminal, $V_{MINUS}$ is the voltage at the second or negative external DC terminal, and $dI_{STRAY}/dt\{S_2\ OFF\}$ is the current gradient when switching OFF the second switch. The inductance for the first switch is calculated according to an equation, $L_{S1} = [V_{AC} - V_{PLUS}]/[dI_{STRAY}/dt]\{S_2\ OFF\}$, where $L_{S1}$ is the total inductance of the first switch, $V_{AC}$ is the voltage at the AC external terminal, $V_{PLUS}$ is the voltage at the first or positive external DC terminal, and $dI_{STRAY}/dt\{S_2\ OFF\}$ is the current gradient, when switching OFF the second switch.

For the complementary circuit, inductances are calculated for the external bus bar and for the second switch based on the ideal DC bus voltage and the measured voltages at the first or positive external DC terminal, the second or negative external DC terminal, and the external AC terminal, and a measured current gradient, when switching OFF the first switch. The inductance for the external bus bar for the complementary circuit when switching OFF the first switch is calculated according to an equation, $L_{BUS} = (V_{PLUS} - V_{MINUS})/[dI_{STRAY}/dt]\ \{S_1\ OFF\}$, where $L_{BUS}$ is the inductance of the DC bus, including bus bar, ESL, etc. $V_{DC}$ is an ideal DC bus voltage, $V_{PLUS}$ is the voltage at the first or positive external DC terminal, $V_{MINUS}$ is the voltage at the second or negative external DC terminal, and $dI_{STRAY}/dt\{S_1\ OFF\}$ is the current gradient when switching OFF the first switch. The inductance for the second switch for the complementary circuit when switching OFF the first switch is calculated according to an equation, $L_{s2} = [V_{MINUS} - V_{AC}]/[dI_{STRAY}/dt]\{S_1 OFF\}$, where $L_{s2}$ is the total inductance of the second switch, $V_{MINUS}$ is the voltage at the second or negative external DC terminal, $V_{AC}$ is the voltage at the external AC terminal, and $dI_{STRAY}/dt\{S_1\ OFF\}$ is the current gradient when switching OFF the first switch.

The peak die voltage is calculated for the second switch based on the ideal external bus voltage, the calculated inductances for the external bus, the first switch, the second switch, and a measured current gradient, when switching OFF the second switch. The peak die voltage for the second switch when switching OFF the second switch is calculated according to an equation, $V_{DIE-S2}=V_{DC+(LBUS}+L_{S1}+L_{S2})* dI_{STRAY}/dt\{S_2 \text{ OFF}\}$, where $V_{DIE-S2}$ is the peak die voltage for the second switch, $V_{DC}$ is the ideal DC bus voltage, $L_{BUS}$ is the inductance of the external bus, $L_{S1}$ is the total inductance of the first switch, $L_{S2}$ is the total inductance of the second switch, and $dI_{STRAY}/dt\{S_2 \text{ OFF}\}$ is the measured current gradient, when switching OFF the second switch.

The peak die voltage for the first switch is calculated based on the ideal external bus voltage, the calculated inductances for the external bus, the first switch, the second switch, and a measured current gradient, when switching OFF the first switch. The peak die voltage for the first switch when switching OFF the first switch is calculated according to the equation, $V_{DIE-S1}=V_{DC+(LBUS}+L_{S1}+L_{S2})*dI_{STRAY}/dt\{S_{S1}\text{OFF}\}$, where $V_{DIE-S1}$ is the peak die voltage for the first switch, $V_{DC}$ is the ideal DC bus voltage, $L_{BUS}$ is the inductance for the external bus, $L_{S1}$ is the calculated inductance of the first switch, $L_{S2}$ is the calculated inductance for the second switch, and $dI_{STRAY}/dt\{S_1 \text{ OFF}\}$ is the measured current gradient, when switching OFF the first switch.

Various preferred embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the present invention.

What is claimed is:

1. A method of non-destructively determining power transistor peak die voltage based on external terminal properties of an inverter, the inverter comprising a first switch and an anti-paralleled diode, a second switch and an anti-paralleled diode, the first and the second switches coupled in series between a first external DC terminal and a second external DC terminal, and an external AC terminal coupled between the first and the second switches, the method comprising:

determining a first voltage across the first external DC terminal and the AC terminal when switching OFF the second switch;

determining a second voltage across the second external DC terminal and the AC terminal when switching OFF the first switch; and determining a peak die voltage for at least one of the first and the second switches based in part on at least one of the determined first and second voltages.

2. The method of claim 1, further comprising:

determining a bus voltage across the first and the second external DC terminals, and wherein determining a peak die voltage for at least one of the first and the second switches includes summing the determined bus voltage, the determined first voltage and the determined second voltage.

3. The method of claim 1, further comprising:

determining a current gradient when switching OFF at least one of the first and the second switches;

determining an inductance of the first switch as the quotient of a dividend equal to a difference between the determined voltage across the second external DC terminal and the AC terminal and a DC bus voltage, and a divisor equal to the current gradient; and determining an inductance of the second switch as the quotient of a dividend equal to a difference between the determined voltage across the first external DC terminal and the AC terminal and the DC bus voltage, and a divisor equal to the current gradient.

4. The method of claim 3 wherein determining a peak die voltage for at least one of the first and the second switches based in part on at least one of the determined voltages includes:

determining a sum of the inductance of the first switch and the inductance of the second switch;

determining a product of the current gradient and the determined sum of the inductances of the first and the second switches; and determining a sum of the bus voltage and the determined product.

5. The method of claim 3 wherein determining a peak die voltage for at least one of the first and the second switches based in part on at least one of the determined voltages includes:

determining a sum of the inductance of the first switch, the inductance of the second switch, and an inductance of the DC bus;

determining a product of the current gradient and the determined sum of the inductances of the first and the second switches and the DC bus; and determining a sum of the DC bus voltage and the determined product.

6. A method of non-destructively determining power transistor peak die voltage $V_{DIE-PEAK}$ based on external terminal properties of an inverter, the inverter comprising a first switch and an anti-paralleled diode, a second switch and an anti-paralleled diode, the first and the second switches coupled in series between a first external DC terminal and a second external DC terminal, and an external AC terminal coupled between the first and the second switches, the method comprising:

determining a first switch voltage $V_{S1}$ across the first external DC terminal and the AC terminal when switching OFF the second switch;

determining a second switch voltage $V_{S2}$ across the second external DC terminal and the AC terminal when switching OFF the first switch;

determining a bus voltage $V_{BUS}$; and determining a peak die voltage $V_{DIE-PEAK}$ for at least one of the first and the second switches according to $V_{BUS}+V_{S1}+V_{S2}$.

7. A method of forming an inverter, the inverter comprising a first switch and an anti-paralleled diode, a second switch and an anti-paralleled diode, the first and the second switches coupled in series between a first external DC terminal and a second external DC terminal, and an external AC terminal coupled between the first and the second switches, the method comprising:

determining a first switch voltage $V_{S1}$ across the first external DC terminal and the AC terminal when switching OFF the second switch;

determining a second switch voltage $V_{S2}$ across the second external DC terminal and the AC terminal when switching OFF the first switch;

determining a bus voltage $V_{BUS}$;

determining a peak die voltage $V_{DIE-PEAK}$ for at least one of the first and the second switches according to $V_{BUS}+V_{S1}+V_{S2}$; and selecting at least one die having a voltage rating based on the determined die voltage for inclusion in the inverter.

8. A method of operating an inverter, the inverter comprising a first switch and an anti-paralleled diode, a second switch and an anti-paralleled diode, the first and the second switches coupled in series between a first external DC terminal and a second external DC terminal, and an external AC terminal coupled between the first and the second switches, the method comprising:

determining a first switch voltage $V_{S1}$ across the first external DC terminal and the AC terminal when switching OFF the second switch;

determining a second switch voltage $V_{S2}$ across the second external DC terminal and the AC terminal when switching OFF the first switch;

determining a bus voltage $V_{BUS}$;

determining a peak die voltage $V_{DIE\text{-}PEAK}$ for at least one of the first and the second switches according to $V_{BUS}+V_{S1}+V_{S2}$; and limiting operation of the inverter to below the determined die voltage.

9. A method of non-destructively determining power transistor peak die voltage $V_{DIE\text{-}PEAK}$ based on external terminal properties of an inverter, the inverter comprising a first switch and an anti-paralleled diode, a second switch and an anti-paralleled diode, the first and the second switches coupled in series between a first external DC terminal and a second external DC terminal, and an external AC terminal coupled between the first and the second switches, the method comprising:

measuring a first switch voltage $V_{S1}$ across the first external DC terminal and the AC terminal when switching OFF the second switch;

measuring a second switch voltage $V_{S2}$ across the second external DC terminal and the AC terminal when switching OFF the first switch;

determining a current gradient dI/dt when switching OFF one of the first and the second switches;

determining a bus voltage $V_{BUS}$; and determining the die voltage for at least one of the first and the second switches according to VDIE-PEAK=VBUS+(LS1+$L_{S2}$)*dI/dt, wherein LS1=(VS2−VBUS)/dI/dt and LS2=(VS1−VBUS)/dI/dt.11.

10. The method of claim 9, further comprising:

determining a first switch inductance $L_{S1}$ according to $L_{S1}=(V_{S2}-V_{BUS})/dI/dt$; and determining a second switch inductance $L_{S2}$ according to $L_{S2}=(V_{S1}-V_{BUS})/dI/dt$.

11. The method of claim 9, further comprising:

selecting at least one die having a voltage rating based on the determined die voltage for inclusion in the inverter.

12. The method of claim 9, further comprising:

limiting operation of the inverter to below the determined die voltage.

13. The method of claim 9, further comprising:

selectively applying control signals to a gate of a first insulated gate bipolar transistor and a gate of a second insulated gate bipolar transistor to turn the first and the second insulated gate bipolar transistors ON and OFF, where the first and the second insulated gate bipolar transistors form the first and the second switches, respectively.

14. A method of non-destructively determining power transistor peak die voltage $V_{DIE\text{-}PEAK}$ based on external terminal properties of an inverter, the inverter comprising a first switch and an anti-paralleled diode, a second switch and an anti-paralleled diode, the first and the second switches coupled in series between a first external DC terminal and a second external DC terminal, and an external AC terminal coupled between the first and the second switches, the method comprising:

measuring a first switch voltage $V_{S1}$ across the first external DC terminal and the AC terminal when switching OFF the second switch;

measuring a second switch voltage $V_{S2}$ across the second external DC terminal and the AC terminal when switching OFF the first switch;

determining a current gradient dI/dt when switching OFF when of the first and the second switches;

determining a bus voltage $V_{BUS}$; and determining the die voltage $V_{DIE\text{-}PEAK}$ for at least one of the first and the second switches according to $V_{DIE}=V_{DC}+(L_{BUS}+L_{S1}+L_{S2})*dI/dt$, wherein $L_{BUS}$ is a bus inductance, $L_{S1}=(V_{S2}-V_{BUS})/dI/dt$ and $L_{S2}=(V_{S1}-V_{BUS})/dI/dt$.

15. The method of claim 14, further comprising:

determining a first switch inductance $L_{S1}$ according to $L_{S1}=(V_{S2}-V_{BUS})/dI/dt$; and determining a second switch inductance $L_{S2}$ according to $L_{S2}=(V_{S1}-V_{BUS})/dI/dt$.

16. The method of claim 14, further comprising:

selecting at least one die having a voltage rating based on the determined die voltage for inclusion in the inverter.

17. The method of claim 14, further comprising:

limiting operation of the inverter to below the determined die voltage.

18. The method of claim 14, further comprising:

selectively applying control signals to a gate of a first insulated gate bipolar transistor and a gate of a second insulated gate bipolar transistor to turn the first and the second insulated gate bipolar transistors ON and OFF, where the first and the second insulated gate bipolar transistors form the first and the second switches, respectively.

19. A system for non-destructively determining power transistor peak die voltage based on external terminal properties of an inverter, the inverter comprising a first switch and an anti-paralleled diode, a second switch and an anti-paralleled diode, the first and the second switches coupled in series between a first external DC terminal and a second external DC terminal, and an external AC terminal coupled between the first and the second switches, the system comprising:

means for determining a first switch voltage $V_{S1}$ across the first external DC terminal and the AC terminal when switching OFF the second switch;

means for determining a second switch voltage $V_{S2}$ across the second external DC terminal and the AC terminal when switching OFF the first switch;

means for determining a bus voltage, $V_{BUS}$; and means for determining a peak die voltage $V_{DIE\text{-}PEAK}$ for at least one of the first and the second switches according to $V_{BUS}+V_{S1}+V_{S2}$.

20. A system for non-destructively determining power transistor peak die voltage based on external terminal properties of an inverter, the inverter comprising a first switch and an anti-paralleled diode, a second switch and an anti-paralleled diode, the first and the second switches coupled in series between a first external DC terminal and a second external DC terminal, and an external AC terminal coupled between the first and the second switches, the system comprising:

means for measuring a first switch voltage $V_{S1}$ across the first external DC terminal and the AC terminal when switching OFF the second switch;

means for determining a second switch voltage $V_{S2}$ across the second external DC terminal and the AC terminal when switching OFF the first switch;

means for determining a current gradient dI/dt when switching OFF one of the first and the second switches;

means for determining a bus voltage $V_{BUS}$; and means for determining the die voltage for at least one of the first and the second switches according to $V_{DIE-PEAK} = V_{BUS} + (L_{S1} + L_{S2})^* dI/dt$, wherein $L_{S1} = (V_{S2} - V_{BUS})/dI/dt$ and $L_{S2} = (V_{S1} - V_{BUS})/dI/dt$.

21. The system of claim 20, further comprising:

means for determining a first switch inductance $L_{S1}$ according to $L_{S1} = (V_{S2} - V_{BUS})/dI/dt$; and means for determining a second switch inductance $L_{S2}$ according to $L_{S2} = (V_{S1} - V_{BUS})/dI/dt$.

22. A system for non-destructively determining power transistor peak die voltage based on external terminal properties of an inverter, the inverter comprising a first switch and an anti-paralleled diode, a second switch and an anti-paralleled diode, the first and the second switches coupled in series between a first external DC terminal and a second external DC terminal, and an external AC terminal coupled between the first and the second switches, the system comprising:

means for measuring a first switch voltage $V_{S1}$ across the first external DC terminal and the AC terminal when switching OFF the second switch;

means for measuring a second switch voltage $V_{S2}$ across the second external DC terminal and the AC terminal when switching OFF the first switch;

means for determining a current gradient dI/dt when switching OFF one of the first and the second switches;

means for determining a bus voltage $V_{BUS}$; and means for determining the die voltage $V_{DIE-PEAK}$ for at least one of the first and the second switches according to $V_{DIE-PEAK} = V_{DC} + (L_{BUS} + L_{S1} + L_{S2})^* dI/dt$, wherein $L_{BUS}$ is a bus inductance, $L_{S1} = (V_{S2} - V_{BUS})/dI/dt$ and $L_{S2} = (V_{S1} - V_{BUS})/dI/dt$.

23. The system of claim 22, further comprising:

means for determining a first switch inductance $L_{S1}$ according to $L_{S1} = (V_{S2} - V_{BUS})/dI/dt$; and means for determining a second switch inductance $L_{S2}$ according to $L_{S2} = (V_{S1} - V_{BUS})/dI/dt$.

* * * * *